United States Patent
Chen et al.

(10) Patent No.: US 10,520,573 B2
(45) Date of Patent: Dec. 31, 2019

(54) SYSTEM AND METHOD FOR PERFORMING WAVE-ENCODED MAGNETIC RESONANCE IMAGING OF AN OBJECT

(71) Applicants: GENERAL ELECTRIC COMPANY, Schenectady, NY (US); THE BOARD OF TRUSTEES OF THE LELAND STANFORD JUNIOR UNIVERSITY, Palo Alto, CA (US)

(72) Inventors: Feiyu Chen, Stanford, CA (US); Tao Zhang, Houston, TX (US); Joseph Y. Cheng, Stanford, CA (US); Valentina Taviani, Menlo Park, CA (US); Brian Hargreaves, Stanford, CA (US); John Pauly, Stanford, CA (US); Shreyas Vasanawala, Stanford, CA (US)

(73) Assignees: GENERAL ELECTRIC COMPANY, Schenectady, NY (US); THE BOARD OF TRUSTEES OF THE LELAND STANFORD JUNIOR UNIVERSITY, Palo Alto, CA (US)

( * ) Notice: Subject to any disclaimer, the term of this patent is extended or adjusted under 35 U.S.C. 154(b) by 445 days.

(21) Appl. No.: 15/481,893

(22) Filed: Apr. 7, 2017

(65) Prior Publication Data
US 2018/0143277 A1 May 24, 2018

Related U.S. Application Data

(60) Provisional application No. 62/425,966, filed on Nov. 23, 2016.

(51) Int. Cl.
*G01V 3/00* (2006.01)
*G01R 33/561* (2006.01)
*G01R 33/48* (2006.01)
*G01R 33/565* (2006.01)

(52) U.S. Cl.
CPC ...... *G01R 33/5611* (2013.01); *G01R 33/4822* (2013.01); *G01R 33/56509* (2013.01)

(58) Field of Classification Search
CPC .................................................. G01R 33/4822
USPC .................................................. 324/309, 307
See application file for complete search history.

(56) References Cited

U.S. PATENT DOCUMENTS

| | | | |
|---|---|---|---|
| 6,841,998 B1 | 1/2005 | Griswold | |
| 7,301,342 B2 | 11/2007 | Moriguchi et al. | |
| 7,486,075 B2 | 2/2009 | Brau et al. | |
| 8,379,951 B2 | 2/2013 | Lustig et al. | |
| 8,981,776 B2 | 3/2015 | Setsompop et al. | |
| 9,739,857 B2* | 8/2017 | Porter | G01R 33/4818 |
| 2019/0128980 A1* | 5/2019 | Porter | G01N 24/081 |

* cited by examiner

*Primary Examiner* — Louis M Arana
(74) *Attorney, Agent, or Firm* — Grogan, Tuccillo & Vanderleeden, LLP

(57) ABSTRACT

A method for performing wave-encoded magnetic resonance imaging of an object is provided. The method includes applying one or more wave-encoded magnetic gradients to the object, and acquiring MR signals from the object. The method further includes calibrating a wave point-spread function, and reconstructing an image from the MR signals based at least in part on the calibrated wave point-spread function. Calibration of the wave point-spread function is based at least in part on one or more intermediate images generated from the MR signals.

20 Claims, 6 Drawing Sheets

SYSTEM AND METHOD FOR PERFORMING WAVE-ENCODED MAGNETIC RESONANCE IMAGING OF AN OBJECT

CROSS-REFERENCE TO RELATED APPLICATIONS

This application claims the benefit of U.S. Provisional Patent Application No. 62/425,966 filed on Nov. 23, 2016, which is herein incorporated by reference in its entirety.

STATEMENT OF GOVERNMENT SUPPORT

This invention was made with Government support under contracts EB009690, EB019241, and EB015891 awarded by the National Institutes of Health. The Government has certain rights in the invention.

BACKGROUND

Technical Field

Embodiments of the present invention relate generally to magnetic resonance imaging ("MRI") systems, and more specifically, to a system and method for performing wave-encoded magnetic resonance imaging of an object.

Discussion of Art

MRI is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses from the nuclei as the excited protons relax back to their lower energy normal state, a map or image of these nuclei responses as a function of their spatial location is generated and displayed. An image of the nuclei responses provides a non-invasive view of a subject's internal structure.

Wave-encoded MRI is a form of MRI in which oscillating magnetic gradients are applied during the readout of each k-space line on the phase and slice-encoding axes. The resulting sampling strategy spreads the aliasing in all spatial directions and allows highly accelerated imaging with minimal residual artifacts due to efficient use of the three-dimensional ("3D") distribution of RF coil sensitivities.

Many traditional MR acquisition techniques for wave-encoded MRI, hereinafter also referred to simply as "wave-encoded MR acquisition techniques", such as Wave-CAIPI and Wave-CS, however, often require a separate calibration scan to estimate a wave-encoded point-spread function ("PSF"). The addition of a separate calibration scan, however, increases the complexity and total time of a wave-encoded MRI scan, hereinafter also referred to simply as "MRI scan" and/or "scan". While some wave-encoded MR acquisition techniques utilize theoretically estimated wave PSF, such wave-encoded MR acquisition techniques often produce image artifacts, e.g., distortion and blurring. Additionally, while some MRI systems utilize auto-calibrated wave-CAIPI reconstruction for estimating wave PSF with CAPIRINHA-type uniform under-sampling, such MRI systems typically have excessively long time requirements, to the point of being impractical for many sampling patterns, e.g., variable-density and pseudo-random sampling.

Further, many traditional wave-encoded MR acquisition techniques usually require additional prephasers and rephasers to refocus the MR signal to central k-space. The use of prephasers and rephasers, however, often increases the total scan time and/or echo spacing requirements for fast spin echo based MR acquisitions.

Further still, many traditional wave-encoded MR acquisition techniques require an additional calibration scan for estimating RF coil sensitivity maps, which adds time and complexity to an MRI scan.

Yet further still, the k-space modulation introduced by wave gradients often makes applying known motion-correction methods to traditional wave-encoded MR acquisition techniques difficult.

What is needed, therefore, is an improved system and method for performing wave-encoded magnetic resonance imaging of an object.

BRIEF DESCRIPTION

In an embodiment, a method for performing wave-encoded magnetic resonance imaging of an object is provided. The method includes applying one or more wave-encoded magnetic gradients to the object, and acquiring MR signals from the object. The method further includes calibrating a wave point-spread function and reconstructing an image from the MR signals based at least in part on the calibrated wave point-spread function. Calibration of the wave point-spread function is based at least in part on one or more intermediate images generated from the MR signals.

In another embodiment, an MRI system for performing wave-encoded magnetic resonance imaging of an object is provided. The MRI system includes an MRI controller operative to: apply one or more wave-encoded magnetic gradients to the object; acquire MR signals from the object; calibrate a wave point-spread function; and reconstruct an image from the MR signals based at least in part on the calibrated wave point-spread function. The MRI controller calibrates the wave point-spread function based at least in part on one or more intermediate images generated from the MR signals.

In yet another embodiment, a non-transitory computer readable medium storing instructions is provided. The stored instructions are configured to adapt an MRI controller to: apply one or more wave-encoded magnetic gradients to an object; acquire MR signals from the object; calibrate a wave point-spread function; and reconstruct an image from the MR signals based at least in part on the calibrated wave point-spread function. Calibration of the wave point-spread function is based at least in part on one or more intermediate images generated from the MR signals.

DRAWINGS

The present invention will be better understood from reading the following description of non-limiting embodiments, with reference to the attached drawings, wherein below:

DETAILED DESCRIPTION

Figure 1:
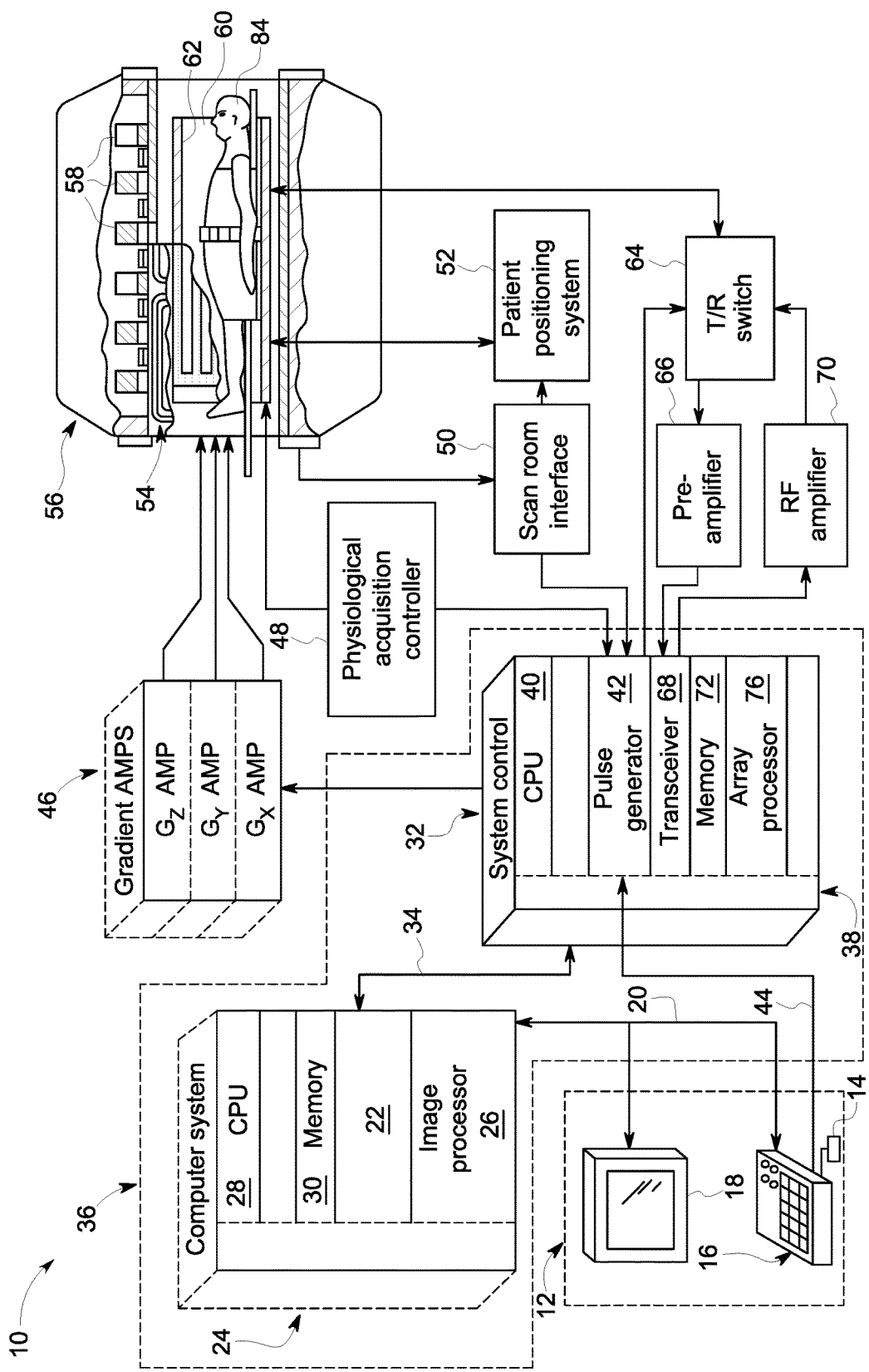
FIG. 1 is a block diagram of an exemplary MRI system for performing wave-encoded magnetic resonance imaging of an object, in accordance with an embodiment of the present invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present.

Further, while the embodiments disclosed herein are described with respect to an MRI system, it is to be understood that embodiments of the present invention may be applicable to other imaging systems which utilize wave-encoded magnetic gradients. Further still, as will be appreciated, embodiments of the present invention related imaging systems may be used to analyze tissue generally and are not limited to human tissue.

Referring now to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60). As will be appreciated, however, embodiments of the invention may use head coils and/or other localized RF coils.

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space 74 (FIG. 8) has been acquired in the memory module 72. This raw k-space data/datum is rearranged into separate k-space data arrays for each image to be reconstructed, and each of these is input to an array processor 76 which operates to Fourier transform the data into an array of image data, i.e., "images space." This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
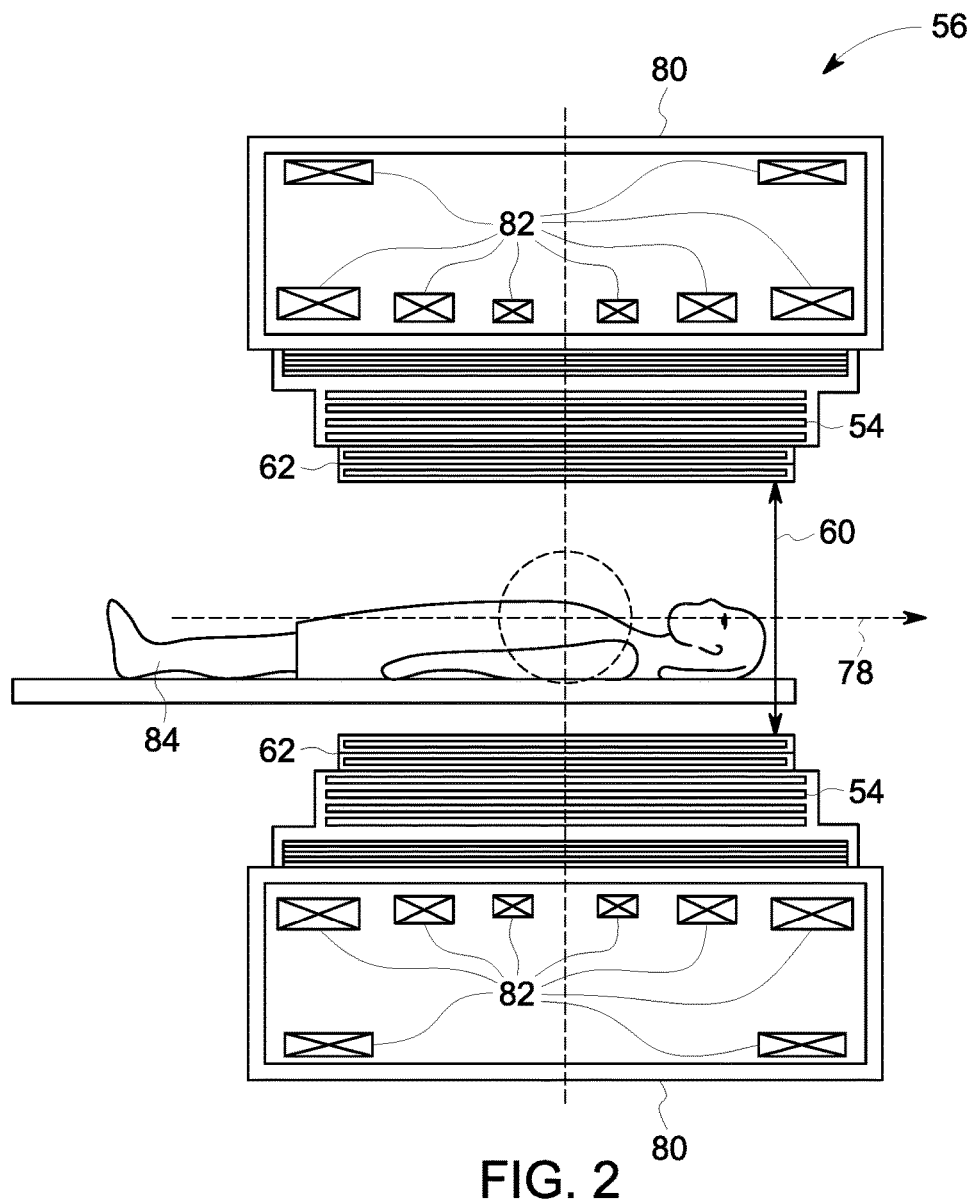
FIG. 2 is a schematic cross-sectional view of a magnet assembly of the MRI system of FIG. 1, in accordance with an embodiment of the present invention.

As illustrated in FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82 that form the polarizing magnet 58. The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/object/imaged subject 84 is inserted into the magnet assembly 56.

Figure 3:
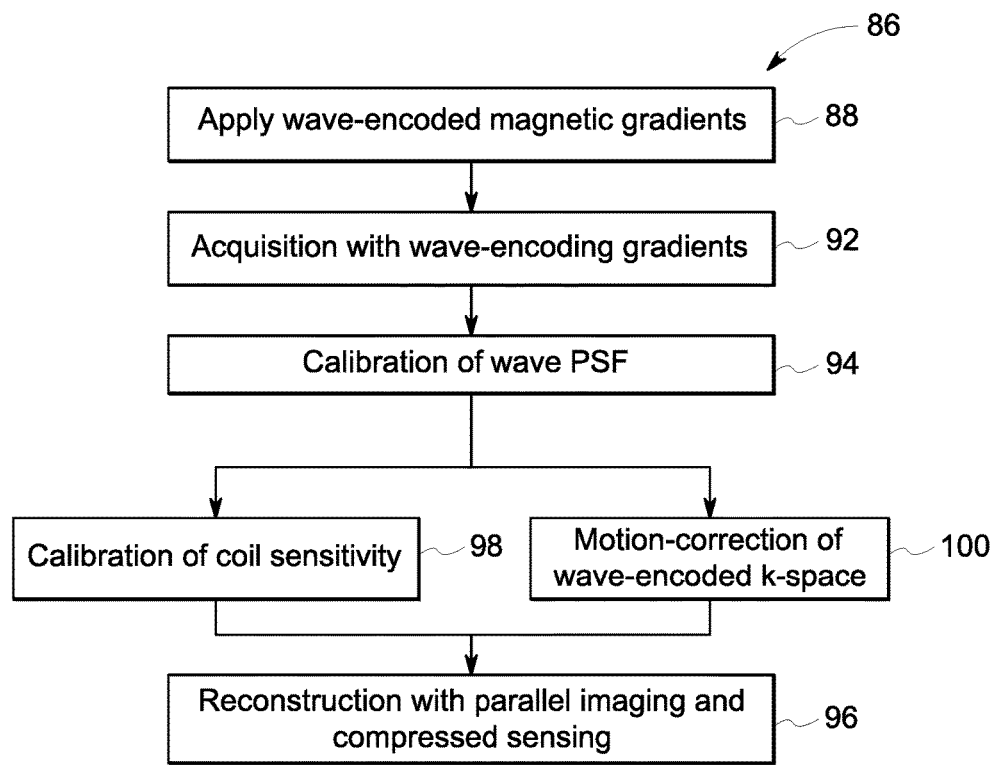
FIG. 3 is a flow chart depicting a method for performing wave-encoded magnetic resonance imaging of an object via the MRI system of FIG. 1, in accordance with an embodiment of the present invention.

Turning now to FIG. 3, a method 86 for performing wave-encoded MRI of the object 84, in accordance with embodiments of the invention, is shown. The method 86 includes applying 88 one or more wave-encoded magnetic gradients 90 (FIG. 4) to the object 84 via the MRI system 10, acquiring 92 MR signals from the object 84 via the MRI system 10, calibrating/estimating 94 a wave PSF via the MRI system 10, and reconstructing 96 an image from the MR signals based at least in part on the calibrated wave PSF via the MRI system 10. As will be appreciated, the calibration 94 of the wave PSF is based at least in part on one or more intermediate images generated from the MR signals via the MRI system 10. In other words, the wave PSF of the present invention is calibrated based at least in part on image space, i.e., the intermediate images, generated by Fourier transforming the MR signals as discussed above. As shown in FIG. 3, in embodiments, the method 86 may further include calibrating/estimating 98 a coil sensitivity map, and/or motion-correcting 100 the MR signals.

Figure 4:
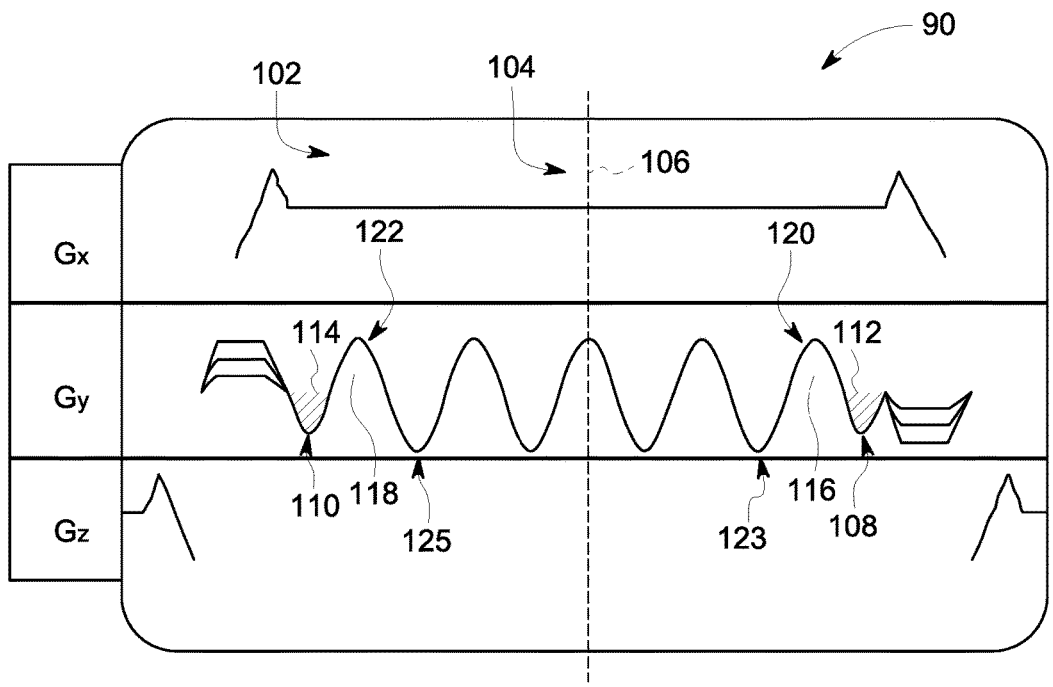
FIG. 4 is a diagram depicting one or more wave-encoded magnetic gradients applied to an object via the MRI system of FIG. 1, in accordance with an embodiment of the present invention.

Moving now to FIG. 4, a diagram of the wave-encoded magnetic gradients 90 is shown. The wave-encoded magnetic gradients 90 are applied to the object 84 by one or more of the gradient coils of the gradient coil assembly 54 during the readouts 102 (best seen in FIG. 6) of the MR signal acquisition such that the corresponding k-space 74 (FIG. 8) may be highly under-sampled. As also shown in FIG. 4, the wave-encoded magnetic gradients 90 may be applied by the gradient coils along the x, y, z axes of the encompassing gradient coil assembly 54, and/or in any direction within the space defined by the x, y, and z, axes. For example, FIG. 4 depicts a wave-encoded magnetic gradient Gy and two traditional magnetic gradients Gx and Gz, which correspond to the x, y, and z directions of the gradient coil assembly 54. While FIG. 4 depicts Gx and Gz as traditional magnetic gradients, it will be understood that the Gx and Gz magnetic gradients may also be wave-encoded.

As will be appreciated, in certain aspects of the invention, the wave-encoded magnetic gradients 90 may be self-refocusing with respect to a center 104 (also shown in FIG. 8) of the corresponding k-space 74. In other words, the centers 106 of the wave-encoded magnetic gradients 90 may be aligned with the center 104 of the corresponding k-space 74, which, as will be appreciated, reduces and/or eliminates the need for prephasers and/or rephasers, thereby reducing the repetition time ("TR") and/or echo spacing. As such, the wave-encoded magnetic gradients 90 may be symmetrical about their centers 106, and/or be configured such that at least one wave-encoded magnetic gradient, e.g., Gy as shown in FIG. 4, has a first lobe 108 and a final lobe 110 with integrals 112 and 114, i.e., the area under the curve, that are each less than or equal to about half the integral 116 or 118 of a middle lobe 120 or 122. As will be appreciated, in embodiments, both the integral of a first portion of a wave-encoded magnetic gradient, i.e., the area under the curve of Gy to the right of the refocusing point 104/106, and the integral of a second portion of the same wave-encoded magnetic gradient, i.e., the area under the curve of Gy to the left of the refocusing point 104/106, are each zero (0). It will also be understood that, in embodiments, the wave-encoded magnetic gradients 90 may be asymmetrical.

Figure 5:
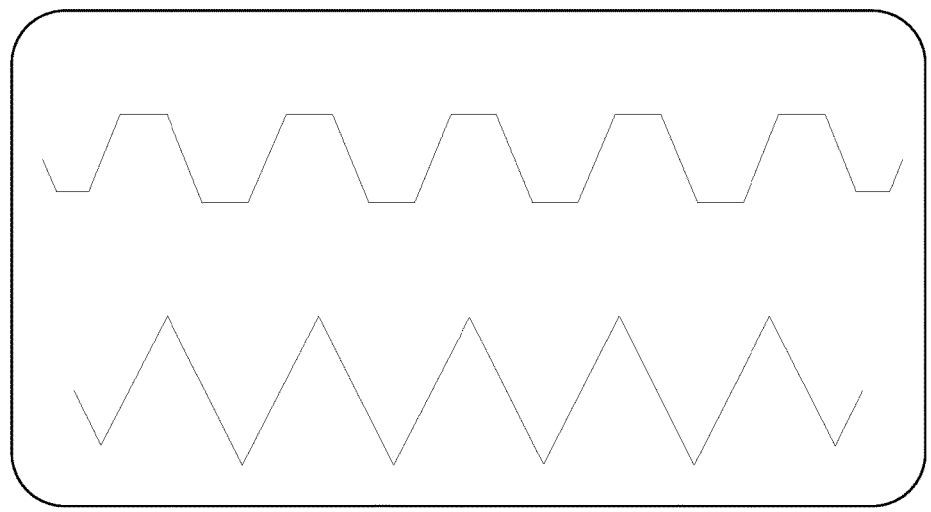
FIG. 5 is another diagram depicting one or more wave-encoded magnetic gradients applied to an object via the MRI system of FIG. 1, in accordance with an embodiment of the present invention.

Additionally, the wave-encoded magnetic gradients 90 may also be configured to be second-order differential between neighboring/adjacent lobes, e.g., lobes 120 and 123, and lobes 122 and 125, which may mitigate and/or avoid rapid changes in the gradient slew rate. While FIG. 4 depicts the wave-encoded magnetic gradients 90 as sinusoidal, it will be understood that the wave-encoded magnetic gradients 90 may also be triangular, square, trapezoidal, and/or other appropriate wave forms as shown in FIG. 5. Additionally, the amplitude of each lobe 108, 110, 120, 122, 123, 125 may be modified as needed. For example, the central lobes, i.e., lobes near the center 106, may have lower amplitudes than distal lobes, i.e., lobes further away from the center 106, which, as will be understood, may reduce errors in RF coil sensitivity calibration 98 (FIG. 3).

Figure 6:
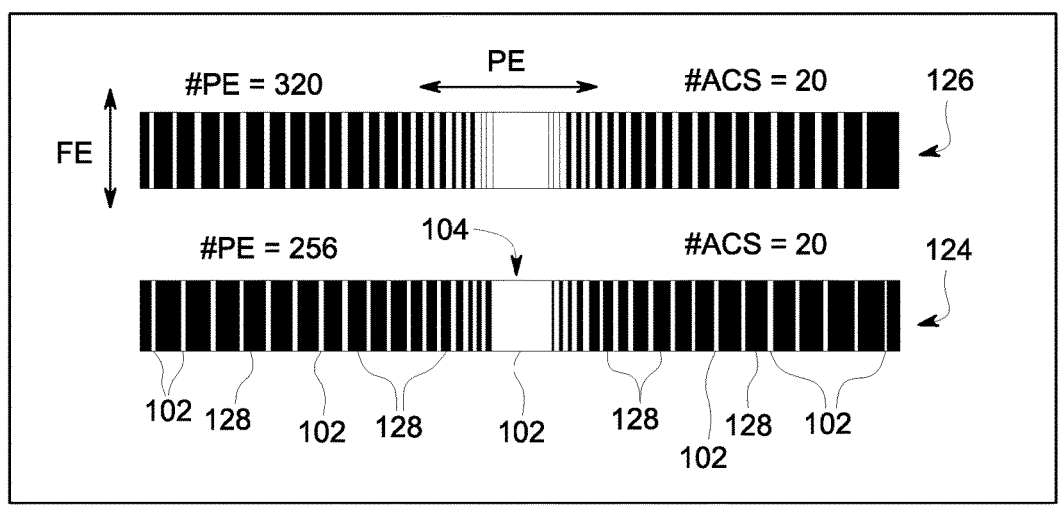
FIG. 6 is a diagram depicting the acquisition of MR signals from an object via the MRI system of FIG. 1 with respect to a corresponding k-space, in accordance with an embodiment of the present invention.

Turning to FIG. 6, a diagram depicting the above mentioned under-sampling of the k-space 74 (FIG. 8) during the acquisition 92 (FIG. 3) of the MR signals is shown. In embodiments, the k-space 74 may be acquired as a series of phase encoding ("PE") lines 124, 126 that progress in the frequency encoding ("FE") domain. As will be understood, the spaces/readouts 102 and segments 128 represent sampled and un-sampled regions of the k-space 74, respectively. As shown in FIG. 6, the acquisition 92 of the MR signals/k-space 74 may be performed via uniform, variable-density, and/or pseudo-random under-sampling. As will be understood, any sampling pattern that acquires a fully sampled auto-calibration region 130 (FIG. 8), i.e., central k-space, may be utilized. The view ordering may also be modified to achieve different contrasts. Additionally, low-frequency signals may be fully acquired in certain aspects of auto-calibration. Variable-density and pseudo-random under-sampling may provide for incoherent aliasing so as to enable compressed sensing reconstruction. As such, in embodiments, the calibration region 130 corresponding to central k-space, i.e., the region surrounding the center 104 of the k-space 74, may have a size of about 20×20 (or twenty (20) central lines in two-dimensional ("2D") imaging applications). A partial-Fourier acquisition may also be utilized during the acquisition 92 (FIG. 3) of the MR signals.

Figure 7:
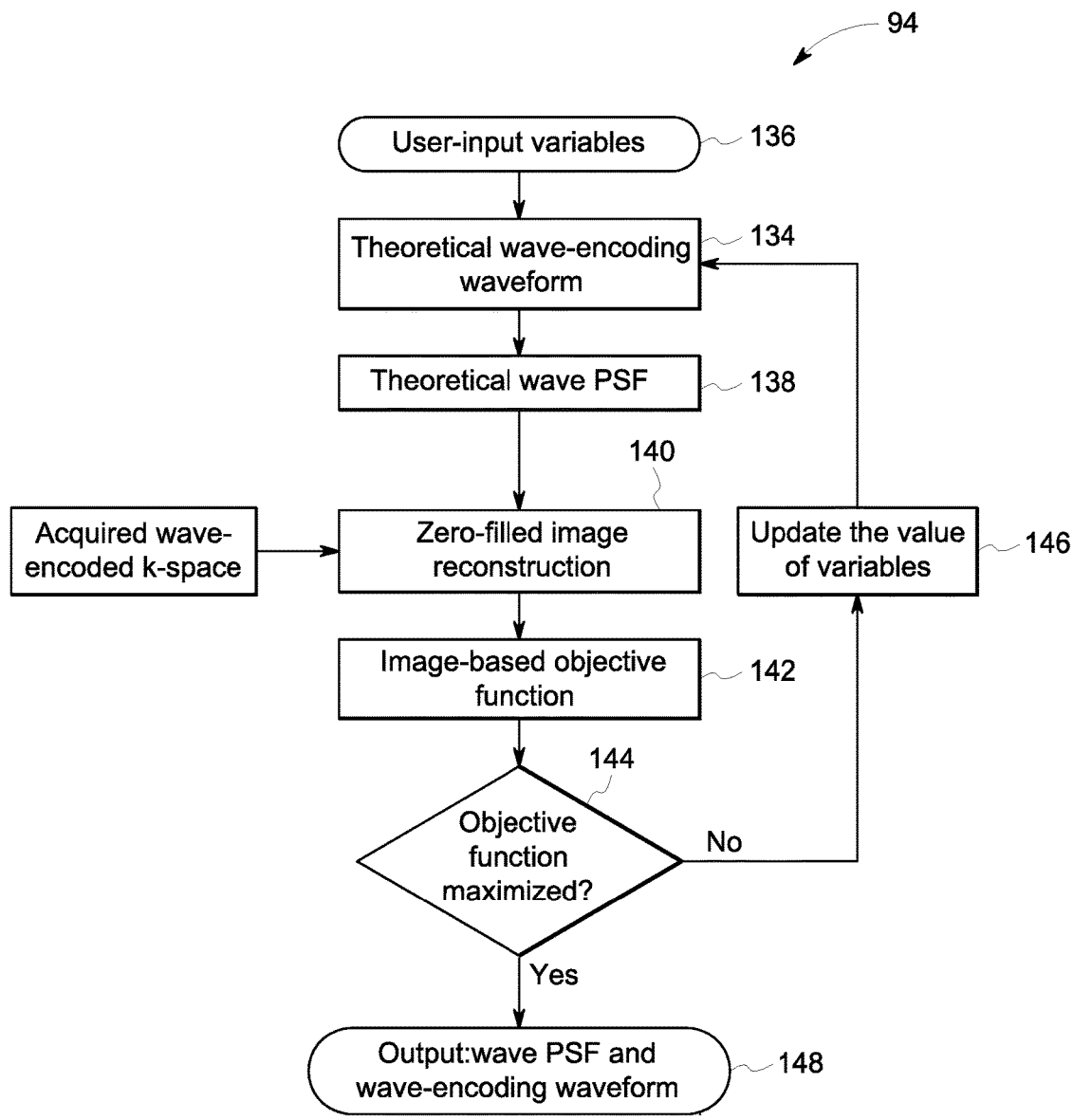
FIG. 7 is a flow chart depicting calibration of a wave point-spread function ("PSF") of the method of FIG. 3, in accordance with an embodiment of the present invention.

Referring now to FIG. 7, as stated above, calibration 94 of the wave PSF in embodiments of the method 86 (FIG. 3) is based on image space, and as such, may be auto-calibrating. For example, calibration 94 may include generating 134 a theoretical wave-encoding gradient waveform based on user defined variables 136, e.g., amplitude, duration, and/or number of cycles for the wave-encoded magnetic gradients 90 (FIG. 4). The theoretical wave PSF may then be calculated 138 with the following equation:

$$PSF[k_x,y,z]=\exp(-i\gamma\int_0^{t[k_x]}(g_y(\tau)\cdot y+g_z(\tau)\cdot z)d\tau))$$

where $g_y$ and $g_z$ are the wave magnetic gradients in the phase- and slice-encoding directions, respectively, and y and z are the position in image space. For 2D imaging applications, the above equation may be simplified to the following:

$$PSF[k_x,y]=\exp(-i\gamma\int_0^{t[k_x]}(g_y(\tau)\cdot y d\tau))$$

The image m can then be reconstructed 140 from the zero-filled wave-encoded k-space s using the theoretical PSF:

$$m = \mathcal{F}_x^{-1}\cdot PSF\cdot \mathcal{F}_y^{-1}\mathcal{F}_z^{-1}s$$

Next, as represented by steps 142, 144, 146, and/or 148, the following metric:

$$G_{obj}(m)=\Sigma_{i,j}(|g_{i,j}(m)|/\Sigma_{i,j}|g_{i,j}(m)|)^2$$

where $g_{i,j}$ is the image gradient at coordinate i,j, may be maximized iteratively through an optimization method, e.g., the Nelder-Mead simplex method, to yield the calibrated wave PSF. As will be appreciated, other appropriate metrics may be used. Thus, the optimization problem can be formulated as:

$$\mathrm{argmin}_{variables}\{-G_{obj}(\mathcal{F}_x^{-1}\cdot PSF(variables)\cdot \mathcal{F}_y^{-1}\mathcal{F}_z^{-1}s)\}$$

where the optimization variables are the amplitude and time delay of the wave-encoded magnetic gradients 90, and the center of the prescribed field of view ("FOV") in the phase-encoding direction.

Figure 8:
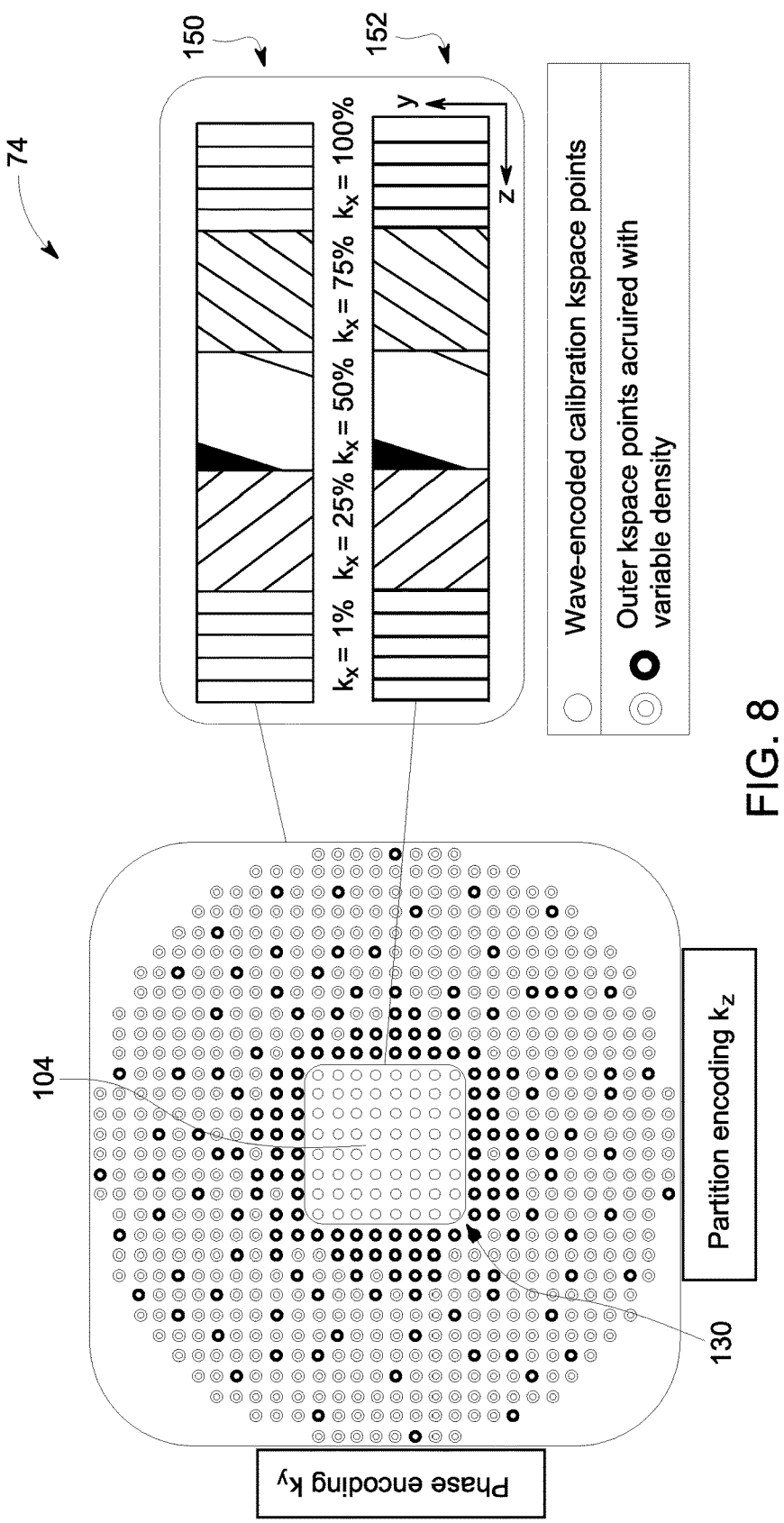
FIG. 8 is a diagram of the corresponding k-space of FIG. 6, in accordance with an embodiment of the present invention.

Moving to FIG. 8, as will be appreciated, wave-encoded MRI usually does not directly provide a Cartesian auto-calibration region for parallel MR imaging, in which two or more RF coils 62 are used to acquire/receive 92 the MR signals from the object 84. As will be appreciated, however, embodiments of the invention may exploit a fully sampled wave-encoded central k-space 74 and the calibrated wave PSF, which can be viewed as a high resolution version 150 of the PSF, to extract a Cartesian fully sampled central k-space 74 for calibration of a coil sensitivity map of one or more of the RF coils 62. As such, the wave-encoded MR signals and the demodulated Cartesian signal may be configured to satisfy the following relationship in a hybrid $k_x$-y-z domain:

$$S_{wave}[k_x,y,z]=PSF[k_x,y,z]\cdot S_{Cartesian}(k_x,y,z)$$

which can be expressed as:

$$PSF[k_x, y, z] = \exp\left(-i\gamma \int (g_y(\tau)\cdot y + g_z(\tau)\cdot z)d\tau\right)$$
$$= \exp(C_1\cdot y + C_2\cdot z)$$
$$= \exp(C_1\cdot \Delta y \cdot i_y + C_2\cdot \Delta z\cdot i_z)$$

where $C_1$ and $C_2$ are constants associated with the $g_y$ and $g_z$ gradients, y and z are positions in image space, $\Delta y$ and $\Delta z$ are the corresponding spatial resolutions, and $i_y$ and $i_z$ are spatial indices. Accordingly, the wave-encoded central k-space 74 can be treated as an independent low-resolution k-space modulated by the same calibrated wave PSF. Thus, by replacing $\Delta y$ and $\Delta z$ with $$\Delta y_{calibration} = \frac{N_y}{N_{y,calibration}}\cdot \Delta y, \text{ and}$$

$$\Delta z_{calibration} = \frac{N_z}{N_{z,calibration}}\cdot \Delta z,$$

respectively, where $N_y$ and $N_z$ define the size of the acquisition matrix, and $N_{y,calibration}$ and $N_{z,calibration}$ represent the size of the calibration region, i.e., the size of the sampled central k-space 74, a low resolution wave PSF 152 can be obtained, which in turn can be demodulated from the wave-encoded MR signals to subsequently reconstruct the Cartesian central k-space using an inverse Fourier transformation. As will be appreciated, the resulting Cartesian k-space center can be used to estimate/calibrate the coil sensitivity map. Accordingly, the k-space 74 in FIG. 8 depicts a representative sampling pattern in the phase- and partition-encoding plane, in which the light gray background indicates the extent of the whole k-space 74 that corresponds to the high resolution wave PSF 150, and where the dark background indicates the extent of the calibration region 130 in k-space 74 that corresponds to the low-resolution wave PSF 152.

Thus, in embodiments, reconstruction 96 (FIG. 3) of an image from the MR signals may be based on parallel imaging and compressed sensing. For example, with a calibrated wave PSF and a calibrated coil sensitivity map, parallel imaging and compressed sensing reconstruction 96 may be performed by solving:

$$\mathrm{argmin}_m|D\mathcal{F}_y\mathcal{F}_z\cdot PSF\cdot \mathcal{F}_xEm-s\|_2^2+\lambda\|\Psi m\|_1$$

where D is a k-space sampling operator, PSF is the wave PSF, E contains the RF coil 62 sensitivities, m is the desired image, s is the under-sampled wave-encoded k-space, W is a wavelet transform operator such that the term $\|\Psi m\|_1$ promotes sparsity of the solution, and λ is the regularization parameter related to the L1-norm of the wavelet coefficients m.

As stated above, embodiments of the method 86 (FIG. 3) may apply motion-correction 100 (FIG. 3) to the MR signals, which may mitigate/reduce and/or eliminate intra-scan motion artifacts. For example, linear phase correction may be applied to correct each readout of the motion-corrupted wave-encoded k-space 74. Accordingly, the relation between a motion-corrupted wave-encoded k-space 74 signal $S_m$ and the reference wave-encoded k-space signal $S_0$ can be expressed as:

$$S_m[n]=S_0\cdot\exp(i\cdot 2\pi\cdot(k_x[n]\cdot d_x+k_y[n]\cdot d_y+k_z[n]\cdot d_z))\cdot\exp(-C_1\cdot d_y-C_2\cdot d_z)$$

where $d_x$, $d_y$, and $d_z$ are the estimated distances of linear translation in three orthogonal directions and n denotes a particular sampling time point. As shown below, starting from a reference image $m_0[x, y, z]$, the previous relation can be derived according to Fourier theory and the expression of the wave-encoding PSF as follows:

$$S_m[k_x, k_y, k_z] = \mathcal{F}_{y,z}\{PSF[k_x, y, z] \cdot \mathcal{F}_x\{m_0[x + d_x, y + d_y, z + d_z]\}\}$$

$$= \exp(i2\pi k_x d_x) \cdot \mathcal{F}_{y,z}\{PSF[k_x, y, z] \cdot$$

$$\mathcal{F}_x\{m_0[x, y + d_y, z + d_z]\}\}$$

$$= \exp(i2\pi k_x d_x) \cdot \mathcal{F}_{y,z}\{\exp(C_1 y + C_2 z) \cdot$$

$$\mathcal{F}_x\{m_0[x, y + d_y, z + d_z]\}\}$$

$$= \exp(i2\pi k_x d_x) \cdot \exp(-C_1 d_y - C_2 d_z) \cdot$$

$$\mathcal{F}_{y,z}\{\exp(C_1(y + d_y) + C_2(z + d_z)) \cdot$$

$$\mathcal{F}_x\{m_0[x, y + d_y, z + d_z]\}\}$$

$$= \exp(i2\pi(k_x d_x + k_y d_y + k_z d_z)) \cdot \exp(-C_1 d_y - C_2 d_z) \cdot$$

$$S_0[k_x, k_y, k_z]$$

Therefore, any motion-correction technique that uses linear translation estimates to correct motion corrupted MR signals can be applied to wave-encoded data by simply demodulating the following quantity: $\exp(i2\pi(k_x d_x + k_y d_y + k_z d_z)) \cdot \exp(-C_1 d_y - C_2 d_z)$. As will be appreciated, the $\exp(-C_1 d_y - C_2 d_z)$ term compensates for phase shifts due to linear translation of the wave-encoding PSF. Accordingly, other motion-correction methods may also be applied with and/or in place of the above described linear phase correction. For example, embodiments of the invention may apply advanced motion-correction methods based on higher-order phase correction, e.g., auto-focusing, or methods that do not rely on phase correction, e.g., soft-gating and/or locally low rank.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system may include at least one processor and system memory/data storage structures, which may include random access memory (RAM) and read-only memory (ROM). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium," as used herein, refers to any medium that provides or participates in providing instructions to the at least one processor of the system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a method for performing wave-encoded magnetic resonance imaging of an object is provided. The method includes applying one or more wave-encoded magnetic gradients to the object, and acquiring MR signals from the object. The method further includes calibrating a wave point-spread function and reconstructing an image from the MR signals based at least in part on the calibrated wave point-spread function. Calibration of the wave point-spread function is based at least in part on one or more intermediate images generated from the MR signals. In certain embodiments, the one or more wave-encoded magnetic gradients are self-refocusing with respect to a center of a corresponding k-space. In certain embodiments, the one or more wave-encoded magnetic gradients are symmetrical. In certain embodiments, the one or more wave-encoded magnetic gradients are at least one of sinusoidal, triangular, square, and trapezoidal. In certain embodiments, a first integral of a first lobe and a second integral of a final lobe of at least one of the one or more wave-encoded magnetic gradients are less than or equal to about half of a third integral of a middle lobe of the same wave-encoded magnetic gradient. In certain embodiments, the one or more wave-encoded magnetic gradients are second-order differentiable between neighboring lobes. In certain embodiments, acquiring MR signals from the object via the MRI system includes receiving the wave-encoded MR signals via two or more RF coils. In such embodiments, the method further includes calibrating a coil sensitivity map of the two or more RF coils based at least in part on the MR signals and the calibrated wave point-spread function, and reconstructing an image from the MR signals is further based at least in part on the calibrated coil sensitivity map. In certain embodiments, calibrating a coil sensitivity map based at least in part on the MR signals and the calibrated wave point-spread function includes generating a low resolution wave point-spread function from the calibrated wave point-spread function. In such embodiments, the coil sensitivity map is further based at least in part on the low resolution wave point-spread function and central k-space calibration data within the acquired MR signals. In certain embodiments, the method further includes motion-correcting the acquired MR signals. In certain embodiments, motion-correcting the acquired MR signals is based at least in part on localized translation motion estimates.

Other embodiments provide for an MRI system for performing wave-encoded magnetic resonance imaging of an object. The MRI system includes an MRI controller operative to: apply one or more wave-encoded magnetic gradients to the object; acquire MR signals from the object; calibrate a wave point-spread function; and reconstruct an image from the MR signals based at least in part on the calibrated wave point-spread function. The MRI controller calibrates the wave point-spread function based at least in part on one or more intermediate images generated from the MR signals. In certain embodiments, the one or more wave-encoded magnetic gradients are self-refocusing with respect to a center of a corresponding k-space. In certain embodiments, the one or more wave-encoded magnetic gradients are symmetrical. In certain embodiments, the one or more wave-encoded magnetic gradients are at least one of sinusoidal, triangular, square, and trapezoidal. In certain embodiments, a first integral of a first lobe and a second integral of a final lobe of at least one of the one or more wave-encoded magnetic gradients are less than or equal to about half of a third integral of a middle lobe of the same wave-encoded magnetic gradient. In certain embodiments, the one or more wave-encoded magnetic gradients are second-order differentiable between neighboring lobes. In certain embodiments, the MRI system acquires the MR signals via two or more RF coils. In such embodiments, the MRI controller is further operative to calibrate a coil sensitivity map of the two or more RF coils based at least in part on the MR signals and the calibrated wave point-spread function. In certain embodiments, reconstruction of the image via the MRI controller is further based at least in part on the calibrated coil sensitivity map. In certain embodiments, the MRI controller is further operative to generate a low resolution wave point-spread function from the calibrated wave point-spread function. In such embodiments, calibration of the coil sensitivity map via the MRI controller is further based at least in part on the low resolution wave point-spread function and central k-space calibration data within the acquired MR signals. In certain embodiments, the MRI controller is further operative to motion correct the acquired MR signals.

Yet still other embodiments provide for a non-transitory computer readable medium storing instructions. The stored instructions are configured to adapt an MRI controller to: apply one or more wave-encoded magnetic gradients to an object; acquire MR signals from the object; calibrate a wave point-spread function; and reconstruct an image from the MR signals based at least in part on the calibrated wave point-spread function. Calibration of the wave point-spread function is based at least in part on one or more intermediate images generated from the MR signals.

Accordingly, by incorporating self-refocusing wave-encoded magnetic gradient waveforms, some embodiments of the present invention may provide for an Wave-encoded MR acquisition technique that does not require prephasers and rephasers. By incorporating an auto-calibrating technique for estimating wave PSF, some embodiments of the present invention may eliminate the need for external calibrations. As will be appreciated, by excluding prephasers and rephasers and/or external calibrations, some embodiments of the present invention may have greatly improved scan efficiencies over traditional wave-encoded MR acquisition techniques. Such embodiments may also provide for image artifacts due to imperfections in the magnetic gradients to be modeled and corrected simultaneously.

Further, by utilizing a data-driven coil sensitivity map calibration, some embodiments of the present invention may provide for significant improvements in the accuracy of the coil sensitivity map in the presence of motion, which in turn may further provide a more simplified workflow over traditional wave-encoded MR acquisition techniques.

Yet further still, by utilizing motion-correction based on localized translational motion estimates applied to wave-encoded k-space, some embodiments of the present invention may provide for the correction of artifacts due to intra-scan motion by the imaged subject/object.

Additionally, some embodiments of the present invention provide for a wave-encoded MR acquisition technique that incorporates parallel imaging having voxel spreading in the FE direction. Thus, such embodiments make better/more efficient use of RF coil sensitivities so as to achieve lower g-factors than traditional Cartesian acquisitions. As will be appreciated, such embodiments may also provide for higher acceleration factors than traditional Cartesian acquisitions without degrading image quality, and/or having a more uniform distribution of motion artifacts, which in turn may further provide for improved motion robustness over traditional Cartesian acquisitions.

Moreover, by utilizing self-refocusing wave-encoding magnetic gradients, some embodiments of the present invention provide for a wave-encoded MR acquisition technique having a readout duration identical to that of a traditional Cartesian acquisition while maintaining contrast within the generated images. As will also be appreciated, such embodiments provide for a wave-encoded MR acquisition that has the same k-space modulation due to T2 decay as conventional acquisitions for fast spin echo imaging.

Also, by calibrating the wave-encoded magnetic gradients in the image domain, some embodiments of the present invention provide for time improvements over other SENSE-based reconstruction methods, and can additionally be applied to variable-density sampling patterns. Thus, some embodiments of the present invention may provide for simultaneous correction of eddy currents and gradient delays by including their effect in the gradient waveform model.

In summary, some embodiments of the present invention provide for an efficient and motion-robust wave-encoded MR acquisition technique that performs highly accelerated wave-encoded MRI for various clinical applications without increasing the overall scan duration and with minimal impact on workflow.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A method for performing wave-encoded magnetic resonance imaging of an object, the method comprising:
    applying one or more wave-encoded magnetic gradient to the object;
    acquiring MR signals from the object;
    calibrating a wave point-spread function;
    reconstructing an image from the MR signals based at least in part on the calibrated wave point-spread function; and
    wherein calibration of the wave point-spread function is based at least in part on one or more intermediate images generated from the MR signals.

2. The method of claim 1, wherein the one or more wave-encoded magnetic gradients are self-refocusing with respect to a center of a corresponding k-space.

3. The method of claim 1, wherein the one or more wave-encoded magnetic gradients are symmetrical.

4. The method of claim 1, wherein the one or more wave-encoded magnetic gradients are at least one of sinusoidal, triangular, square, and trapezoidal.

5. The method of claim 1, wherein a first integral of a first lobe and a second integral of a final lobe of at least one of the one or more wave-encoded magnetic gradients are less than or equal to about half of a third integral of a middle lobe of the same wave-encoded magnetic gradient.

6. The method of claim 1, wherein the one or more wave-encoded magnetic gradients are second-order differentiable between neighboring lobes.

7. The method of claim 1, wherein acquiring MR signals from the object via the MRI system comprises:
    receiving the wave-encoded MR signals via two or more RF coils; and
    the method further comprises:
        calibrating a coil sensitivity map of the two or more RF coils based at least in part on the MR signals and the calibrated wave point-spread function; and
    wherein reconstructing an image from the MR signals is further based at least in part on the calibrated coil sensitivity map.

8. The method of claim 7, wherein calibrating a coil sensitivity map based at least in part on the MR signals and the calibrated wave point-spread function comprises:
    generating a low resolution wave point-spread function from the calibrated wave point-spread function; and
    wherein the coil sensitivity map is further based at least in part on the low resolution wave point-spread function and central k-space calibration data within the acquired MR signals.

9. The method of claim 1, further comprising:
    motion-correcting the acquired MR signals.

10. The method of claim 9, wherein motion-correcting the acquired MR signals is based at least in part on localized translation motion estimates.

11. An MRI system for performing wave-encoded magnetic resonance imaging of an object, the MRI system comprising:
    an MRI controller operative to:
        apply one or more wave-encoded magnetic gradients to the object;
        acquire MR signals from the object;
        calibrate a wave point-spread function;
        reconstruct an image from the MR signals based at least in part on the calibrated wave point-spread function; and
    wherein the MRI controller calibrates the wave point-spread function based at least in part on one or more intermediate images generated from the MR signals.

12. The MRI system of claim 11, wherein the one or more wave-encoded magnetic gradients are self-refocusing with respect to a center of a corresponding k-space.

13. The MRI system of claim 11, wherein the one or more wave-encoded magnetic gradients are symmetrical.

14. The MRI system of claim 11, wherein the one or more wave-encoded magnetic gradients are at least one of sinusoidal, triangular, square, and trapezoidal.

15. The MRI system of claim 11, wherein a first integral of a first lobe and a second integral of a final lobe of at least one of the one or more wave-encoded magnetic gradients are less than or equal to about half of a third integral of a middle lobe of the same wave-encoded magnetic gradient.

16. The MRI system of claim 11, wherein the one or more wave-encoded magnetic gradients are second-order differentiable between neighboring lobes.

17. The MRI system of claim 11, wherein
    the MRI system acquires the MR signals via two or more RF coils;
    the MRI controller is further operative to calibrate a coil sensitivity map of the two or more RF coils based at least in part on the MR signals and the calibrated wave point-spread function; and
    reconstruction of the image via the MRI controller is further based at least in part on the calibrated coil sensitivity map.

18. The MRI system of claim 17, wherein
    the MRI controller is further operative to generate a low resolution wave point-spread function from the calibrated wave point-spread function; and
    calibration of the coil sensitivity map via the MRI controller is further based at least in part on the low resolution wave point-spread function and central k-space calibration data within the acquired MR signals.

19. The MRI system of claim 11, wherein the MRI controller is further operative to motion correct the acquired MR signals.

20. A non-transitory computer readable medium storing instructions configured to adapt an MRI controller to:
- apply one or more wave-encoded magnetic gradients to an object;
- acquire MR signals from the object;
- calibrate a wave point-spread function;
- reconstruct an image from the MR signals based at least in part on the calibrated wave point-spread function; and
- wherein calibration of the wave point-spread function is based at least in part on one or more intermediate images generated from the MR signals.

* * * * *